United States Patent
Takamizawa et al.

[11] Patent Number: 5,993,493
[45] Date of Patent: Nov. 30, 1999

[54] METHOD OF MANUFACTURING MIRROR-POLISHED SILICON WAFERS, AND APPARATUS FOR PROCESSING SILICON WAFERS

[75] Inventors: Shoichi Takamizawa, Nishishirakawa; Norihiro Kobayashi, Annaka, both of Japan

[73] Assignee: Shin-etsu Handotai Co., Ltd., Tokyo, Japan

[21] Appl. No.: 08/910,396

[22] Filed: Aug. 13, 1997

[30] Foreign Application Priority Data

Aug. 19, 1996 [JP] Japan .................................. 8-235871

[51] Int. Cl.[6] .................................................. H01L 21/20
[52] U.S. Cl. ...................... 29/25.01; 438/471; 438/908; 257/913
[58] Field of Search ............................... 29/25.01, 592.1, 29/825; 438/471, 474, 908; 257/913; 414/935

[56] References Cited

U.S. PATENT DOCUMENTS

| 4,608,096 | 8/1986 | Hill ........................................ 438/476 |
| 4,662,956 | 5/1987 | Roth et al. ............................... 438/504 |
| 4,925,809 | 5/1990 | Yoshiharu et al. ....................... 438/692 |
| 4,951,601 | 8/1990 | Maydan et al. ........................... 118/719 |
| 5,516,706 | 5/1996 | Kusakabe ................................ 438/476 |
| 5,562,800 | 10/1996 | Kawamura et al. ..................... 414/935 |
| 5,834,363 | 11/1998 | Masanori ................................ 438/507 |

FOREIGN PATENT DOCUMENTS 59-186331 10/1984 Japan .
4-2133 1/1992 Japan .

*Primary Examiner*—Donald L. Monin, Jr.
*Assistant Examiner*—Michael Dietrich
*Attorney, Agent, or Firm*—Oliff & Berridge, PLC

[57] ABSTRACT

Two or more processes selected from heat treatment for anihilation of oxygen donors, formation of a gettering region, and formation of a dopant-volatilization-prevention film are simultaneously performed in a common apparatus in accordance with the specifications of silicon wafers to be manufactured. Therefore, productivity can be improved.

7 Claims, 2 Drawing Sheets

METHOD OF MANUFACTURING MIRROR-POLISHED SILICON WAFERS, AND APPARATUS FOR PROCESSING SILICON WAFERS

BACKGROUND OF THE INVENTION

1. Field of the Invention

The present invention relates to a method of manufacturing mirror-polished silicon wafers in which processes such as formation of a gettering region, formation of a dopant-volatilization-prevention film, and heat treatment for anihilation of oxygen donors are performed successively and selectively. The present invention also relates to an apparatus for processing silicon wafers in which processes such as formation of a gettering region, formation of a dopant-volatilization-prevention film, and heat treatment for anihilation of oxygen donors are performed successively and selectively.

2. Description of the Related Art

As shown in FIG. 1, mirror-polished silicon wafers used for manufacture of silicon devices are generally manufactured through a slicing process A for slicing a silicon monocrystalline rod manufactured by a silicon monocrystal manufacturing apparatus; a chamfering process B for chamfering the peripheral edge of each of the silicon wafers thus sliced in the slicing process A in order to prevent the silicon wafer from becoming cracked or chipped; a lapping process C for lapping the thus-chamfered silicon wafer so as to form a flat surface thereon; an etching process D for eliminating mechanical damage remaining in the chamfered and lapped silicon wafer; a mirror-polishing process E for polishing at least one main face of the etched silicon wafer; and a cleaning process F for cleaning the mirror-polished silicon wafer so as to remove polishing agent and foreign matter adhered thereto.

In most cases, the mirror-polishing process E is not performed immediately after the etching process D, but, as shown in FIG. 1, an additional process G is performed between the etching process D and the mirror-polishing process E. Depending on the specifications (or application) of mirror-polished silicon wafers to be manufactured, there is carried out, as the additional process G, heat treatment for anihilation of oxygen donors, or formation of a dopant-volatilization-prevention film or a gettering region (gettering film or gettering damaged layer) on a face (hereinafter referred to as a "back surface") opposite the main face (hereinafter referred to as a "front surface") on which devices will be fabricated. In the example shown in FIG. 1, after silicon wafers undergo the etching process D, a % of the silicon wafers are transported to a process for formation of a dopant-volatilization-prevention film, b % of the silicon wafers are transported to a process for heat treatment for anihilation of oxygen donors, c % of the silicon wafers are transported to a process for formation of a gettering film, and d % of the silicon wafers are transported to a process for formation of a gettering damaged layer. The sum of a, b, c, and d is approximately 100%. Subsequently, x % of the silicon wafers that have undergone the heat treatment for donor anihilation are transported to the process for formation of a dopant-volatilization-prevention film, y % of the heat-treated silicon wafers are transported to the process for formation of a gettering film, and z % of the heat-treated silicon wafers are transported to the process for formation of a gettering damaged layer.

Since the additional processes are conducted at different apparatuses, when the silicon wafers must undergo two or more additional processes, they must be transported from one apparatus to the next apparatus. During such transportation, foreign matters may adhere to the silicon wafers. Therefore, the silicon wafers that have undergone an additional certain process must be cleaned before being subjected to the next additional process. Moreover, since the respective additional processes have different processing performances (throughputs), there is a waiting period before wafers can undergo the next process, resulting in a stock of wafers being formed between processes (hereinafter referred to as "process stock"). Therefore, when two or more kinds of additional processes are performed, the productivity decreases, resulting in an increased cost of mirror-polished silicon wafers. Also, delivery becomes delayed.

Moreover, in recent years, mirror-polished silicon wafers have been required to have various kinds of additional functions such as a gettering function. With this trend, the specifications of mirror-polished silicon wafers to be manufactured have become diversified. Since the number, kinds and sequence of required additional processes depend on a desired additional function and therefore a process stock is generated, the diversification of specifications has also caused an increase in the process stock and a decrease in productivity.

Also, when apparatuses for carrying out the respective additional processes are installed at different sites or in different buildings, silicon wafers must be transported over a long distance between the apparatuses, so that the productivity decreases further.

SUMMARY OF THE INVENTION

In view of the foregoing problems, an object of the present invention is to provide a method of manufacturing mirror-polished silicon wafers and an apparatus for processing silicon wafers, both of which can increase productivity even when two or more additional processes such as formation of a gettering region, formation of a dopant-volatilization-prevention film, and heat treatment for anihilation of oxygen donors are performed, especially for the purpose of manufacturing mirror-polished silicon wafers having various kinds of specifications.

To achieve the above object, the present invention provides a method of manufacturing mirror-polished silicon wafers in which processes such as heat treatment for anihilation of oxygen donors, formation of a gettering region, and formation of a dopant-volatilization-prevention film are selectively performed in accordance with the specifications of mirror-polished silicon wafers to be manufactured. The method is characterized in that two or more processes of the above-described processes are carried out in a common apparatus in accordance with the specifications of the silicon wafers.

The present invention also provides an apparatus for processing silicon wafers which comprises at least two chambers selected from a processing chamber for formation of a gettering region, a processing chamber for formation of a dopant-volatilization-prevention film, and a processing chamber for heat treatment for anihilation of oxygen donors; and silicon wafer transportation means for transporting to the respective processing chambers silicon wafers one by one or a plurality of silicon wafers at a time, wherein the processing chambers can be operated simultaneously.

Preferably, the processing chambers are arranged around the transportation means and are connected together to form a cluster shape.

As described above, two or more processing chambers are provided in a single apparatus. Therefore, cleaning and long-distance transportation of silicon wafers between additional processes become unnecessary, resulting in improved productivity. Also, since the two or more processing chambers can be operated simultaneously, a plurality of kinds of processing can be performed simultaneously within a single apparatus. At this time, the generation of process stock can be prevented by making the processing capabilities (throughputs) of the processing chambers identical to each other, so that the productivity can be further improved. When the processing chambers are arranged around the transportation means and are connected together to form a cluster shape, the additional processes can be freely selected and performed in a desired sequence. Therefore, the single apparatus can cope with the diversification of the specifications of mirror-polished silicon wafers to be manufactured. Moreover, since the time required for transportation between the additional processes can be shortened, the productivity can be further improved.

The present invention provides another apparatus for processing silicon wafers which comprises at least two chambers selected from a processing chamber for formation of a gettering region, a processing chamber for formation of a dopant-volatilization-prevention film, and a processing chamber for heat treatment for anihilation of oxygen donors; and silicon wafer transportation means for transporting to the respective processing chambers silicon wafers one by one or a plurality of silicon wafers at a time, wherein the processing chambers can be operated simultaneously. The apparatus further comprises a controller which controls the processing chambers and the transportation means such that a plurality of kinds of processing can be performed for a plurality of silicon wafers within the shortest possible time. In this apparatus, processing chambers are preferably arranged around the transportation means and are preferably connected together to form a cluster shape.

As described above, through control of the transportation means by the controller, a plurality of kinds of processing can be performed for a plurality of kinds of silicon wafers within the shortest possible time. Therefore, the productivity can be improved even when a plurality of kinds of processing are performed for a plurality of kinds of silicon wafers. The plurality of kinds of processing refer to processing silicon wafers performed in one or more chambers, such as a combination of oxygen donor anihilation heat treatment and formation of a dopant-volatilization-prevention film; sole formation of a dopant-volatilization-prevention film; a combination of formation of a gettering region and formation of a dopant-volatilization-prevention film; and a combination of oxygen donor anihilation heat treatment, formation of a gettering region, and formation of a dopant-volatilization-prevention film.

The present invention provides another method of manufacturing mirror-polished silicon wafers, wherein two or more processes are selected from a process for formation of a gettering region, a process for formation of a dopant-volatilization-prevention film, and a process for heat treatment for anihilation of oxygen donors in accordance with the specifications of mirror-polished silicon wafers to be manufactured; and the two or more selected processes are successively performed without silicon wafers being cleaned between the processes. At this time, the silicon wafers are subjected to the respective processes one silicon at a time or a plurality of silicon wafers at a time such that a plurality of kinds of processing can be performed for a plurality of silicon wafers within the shortest possible time.

The present invention also provides a method of manufacturing mirror-polished silicon wafers characterized in that the above-described apparatus of the present invention is used to manufacture the mirror-polished silicon wafers.

When the above-described apparatus of the present invention is used in order to manufacture mirror-polished silicon wafers having an additional function, desired additional processes can be freely selected from among the above-described additional processes. Also, two or more additional processes can be carried out successively without necessity of cleaning silicon wafers between the processes. Therefore, mirror-polished silicon wafers having various specifications can be manufactured with high productivity. Moreover, when the apparatus for processing silicon wafers according to the present invention is used, a plurality of kinds of processing can be performed for a plurality of silicon wafers within the shortest possible time. Thus, mirror-polished silicon wafers having various specifications can be manufactured within the shortest possible time, i.e., with improved productivity.

In the apparatus for processing silicon wafers according to the present invention or the method of manufacturing mirror-polished silicon wafers according to the present invention, a gettering region is preferably formed by depositing amorphous silicon on a main face of a silicon wafer through use of plasma CVD or by imparting damage to the main face of the silicon wafer through use of plasma etching; a dopant-volatilization-prevention film is preferably formed by forming silicon oxide film or silicon nitride film through use of plasma CVD; and heat treatment for anihilation of oxygen donors is preferably effected by rapid thermal treatment through use of lamp heating. When these methods are employed, the respective additional processes have high throughputs, and the throughputs can be equalized through proper selection of processing conditions. Therefore, no process serves as a rate-determining process, and therefore process stock is generated, resulting in an increased operation rate and improved productivity as compared with a conventional method and apparatus.

In the above-described manufacturing method, there can be used chemically-etched silicon wafers that are manufactured from a plurality of silicon ingots different from one another in terms of conductive type and resistivity.

According to the present invention, in the manufacture of mirror-polished silicon wafers having an additional function imparted by a gettering film or an autodoping preventive film formed on the back surface of the silicon wafer, the size of process stock can be decreased to a great extent in order to increase the operation rate of the apparatus. Also, cleaning of the silicon wafers, which has conventionally been required for each additional process, can be limited to one instance. Moreover, through standardization and simplification of the operation, labor can be saved, and the processing can be completed within the shortest possible time even when there exist mixed lots of silicon wafers of different specifications which differ from one another in terms of processing conditions and the number of silicon wafers to be processed. Accordingly, productivity is improved, the period of time before delivery becomes short, and cost of products can be decreased.

DESCRIPTION OF PREFERRED EMBODIMENTS

Figure 1:
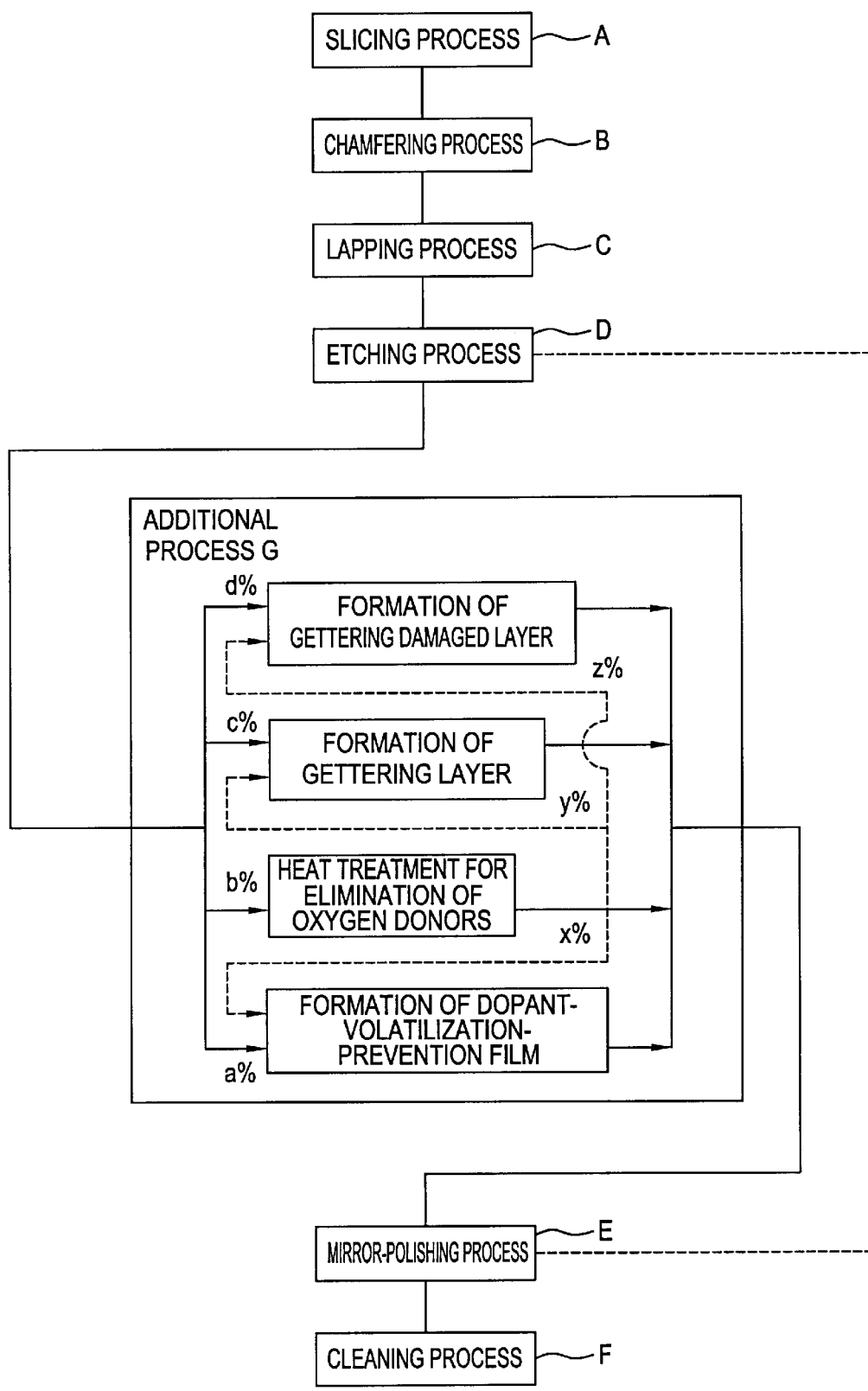
FIG. 1 is a flowchart showing a manufacturing process of mirror-polished silicon wafers.

Embodiments of the present invention will now be described.

In the present invention, the formation of a gettering region refers to forming a gettering film on the back surface of a silicon wafer or imparting damage thereto (to form a gettering damaged layer). When a gettering region is formed, impurities such as heavy metals that are generated during manufacture of silicon devices from a mirror-polished silicon wafer can be collected into the gettering region, which is located outside a region near the surface which serves as a device region, so that the characteristics of the devices are prevented from degradation.

Japanese Patent Application Laid-open (kokai) No. 59-186331 discloses one method of forming a gettering film. In this method, polycrystalline silicon is deposited through use of a reduced-pressure CVD in order to form a gettering film. Also, there has been known a method in which amorphous silicon (α-Si) is deposited in place of polycrystalline silicon (see Japanese Patent Application Laid-open (kokai) No. 4-2133). In the present invention, the method in which amorphous silicon is deposited by plasma CVD is preferably used. When this method is used, a gettering film can be grown at a relatively fast rate even when the deposition temperature is as low as a few hundreds of degrees centigrade, so that the throughput becomes high. Also, the amorphous silicon layer formed by plasma CVD has high gettering capability.

Meanwhile, damage is imparted to the back surface of a silicon wafer through use of a method in which fine particles of $SiO_2$ are blasted against the back surface of a silicon wafer (sand blasting). However, in the apparatus for processing silicon wafers according to the present invention, a method in which etching damage is imparted to the back surface of a silicon wafer through use of plasma etching is preferably used, because this method does not use fine particles, and therefore no particles are generated.

Formation of a dopant-volatilization-prevention film is performed in order to prevent a so-called autodoping phenomenon in which, during epitaxial growth of silicon monocrystalline film on a surface of a mirror-polished silicon wafer, dopants contained in the silicon wafer are released mainly from the back surface of the silicon wafer into a gas phase for epitaxial growth and are taken into an epitaxial layer. Such autodoping phenomenon causes an increase in a transition width (the width of a region in the vicinity of the boundary between the epitaxial layer and the silicon wafer where the dopant concentration changes). In this case, the resistivity of the epitaxial layer becomes difficult to control, and silicon devices fabricated from a silicon wafer whose epitaxial layer has a large transition width do not exhibit designed characteristics and become substandard products.

The dopant-volatilization-prevention film is generally formed by a method in which a silicon oxide film is formed on the back surface of a silicon wafer through use of an atmospheric-pressure CVD apparatus. However, in the apparatus for processing silicon wafers according to the present invention, plasma CVD is advantageously used to form a silicon oxide film. Use of plasma CVD allows a silicon oxide film to be grown at a relatively fast rate even when the deposition temperature is as low as a few hundreds of degrees centigrade, thereby improving the throughput.

Heat treatment for anihilation of oxygen donors may be performed by a method in which a wafer is subjected to heat treatment in an inert gas atmosphere at a temperature of 650–700° C. for 30–60 minutes. However, a rapid thermal process (RTP) through use of lamp heating is suitable for the apparatus for processing silicon wafers according to the present invention. Use of RTP shortens a time required to anihilate oxygen donors to 30–120 seconds, thereby improving the throughput. In some cases, the heat treatment for anihilation of oxygen donors also serves as heat treatment for formation of a gettering sites for intrinsic gettering.

Next, an example of the apparatus for processing silicon wafers according to the present invention will be described with reference to FIGS. 2 and 3.

Figure 2:
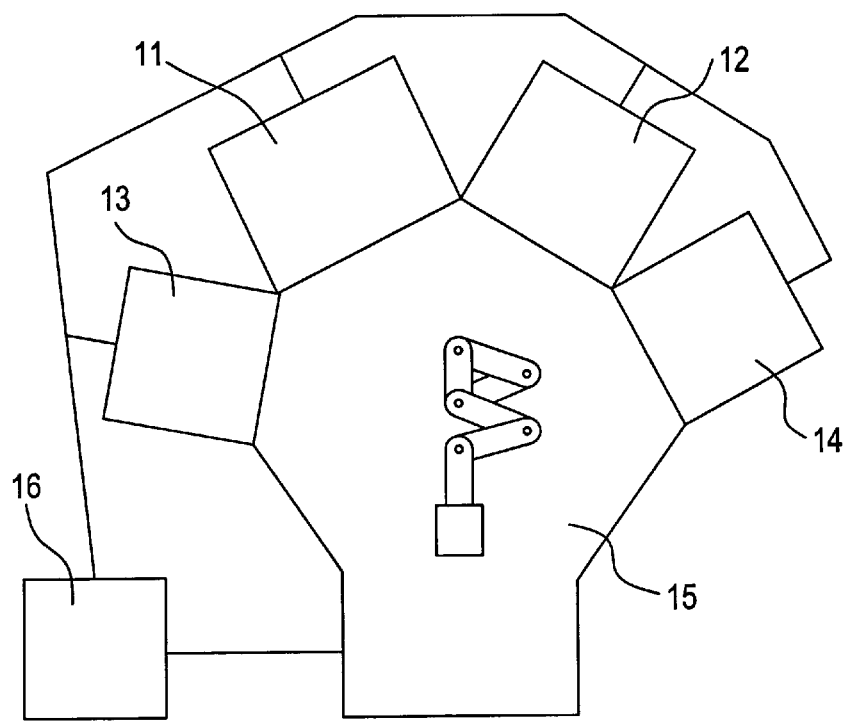
FIG. 2 is a schematic diagram showing an example of an apparatus for processing silicon wafers according to the present invention.
Figure 3:
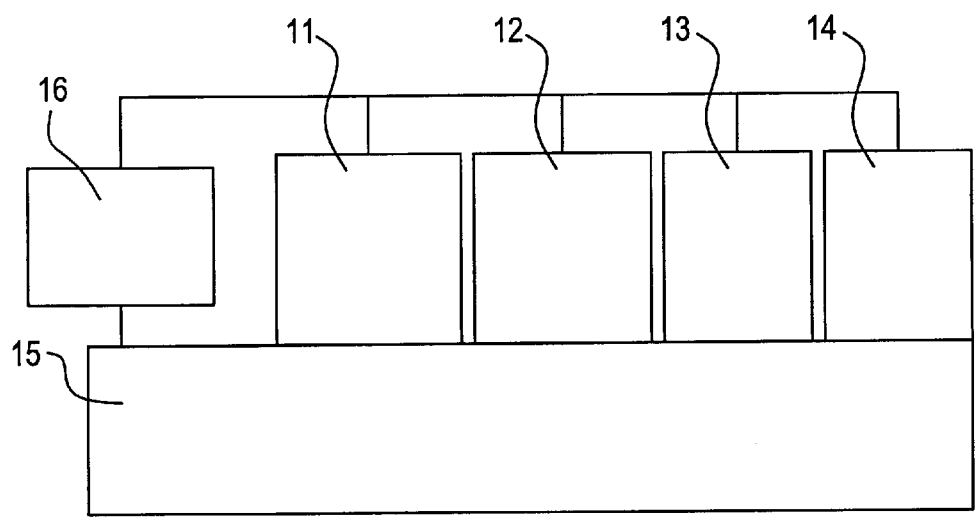
FIG. 3 is a schematic diagram showing another example of an apparatus for processing silicon wafers according to the present invention.

In FIGS. 2 and 3, numeral 11 denotes a processing chamber for depositing amorphous silicon by plasma CVD, numeral 12 denotes a processing chamber for forming silicon oxide film by plasma CVD, numeral 13 denotes a processing chamber for imparting damage to the back surface of a silicon wafer by plasma etching, numeral 14 denotes a processing chamber for RTP, numeral 15 denotes silicon-wafer transportation means, and numeral 16 denotes a controller.

The processing chambers 11–14 can be operated simultaneously. In each of the processing chambers 11–14, silicon wafers can be processed one by one (single wafer processing) or batch by batch, with each batch including a few wafers (batch processing). When gases supplied to the processing chambers 11 and 12 are switched, amorphous silicon can be deposited in the processing chamber 12, while silicon oxide film can be formed in the processing chamber 11; or composite film composed of amorphous silicon film and silicon oxide film can be formed in the processing chamber 11 or the processing chamber 12.

Although the apparatus for processing silicon wafers shown in FIGS. 2 and 3 has four processing chambers, the apparatus for processing silicon wafers according to the present invention is not limited to four and is characterized by having two or more processing chambers. That is, the apparatus according to the present invention has at least two processing chambers selected from a processing chamber for formation of a gettering region, a processing chamber for formation of a dopant-volatilization-prevention film, and a processing chamber for heat treatment for anihilation of oxygen donors. The expression "two processing chambers" encompasses a combination of two gettering-region-forming chambers for forming gettering regions by two different methods as well as other combinations of processing chambers.

Any transportation means can be used as the transportation means 15 insofar as it is capable of transporting silicon wafers to and from an arbitrary processing chamber one wafer at a time or a plurality of wafers at a time and of transporting the silicon wafers to another processing chamber.

As shown in FIG. 2, the processing chambers 11–14 are disposed to surround the transportation means 15 and are connected together in a cluster shape. Alternatively, as shown in FIG. 3, the processing chambers 11–14 are arranged straight along the transportation means 15.

As shown in FIGS. 2 and 3, in the apparatus for processing silicon wafers according to the present invention, the processing chambers 11–14 and the transportation means 15 are connected to a controller 16 that allows a plurality of kinds of processing to be performed within the shortest possible time. The controller 16 is mainly composed of an input section, a computation section, and a control section (all unillustrated).

The apparatus of the present invention is used as follows. Through the processes A to D shown in FIG. 1, silicon wafers are manufactured from a plurality of silicon ingots of different conductive types having different resistivities. The thus-manufactured silicon wafers are classified in accordance with their conductive types and resistivities in order to form groups of silicon wafers (lots) of different kinds. One or more lots of different kinds are loaded into the apparatus. At this time, for each kind, required additional processes, the sequence of them, and the number of silicon wafers to be processed are input to the controller 16 through the input section thereof. The computation section of the controller 16 stores therein a program for determining and executing processing operation based on the processing conditions and the number of silicon wafers to be processed such that the total processing time can be made as short as possible. In accordance with the result of computation, the control section of the controller 16 controls the processing chambers 11–14 and the transportation means 15. Accordingly, the apparatus of the present invention can complete the processing with the shortest possible time even when lots of wafers having different specifications exist in a mixed state.

The silicon wafers loaded into the apparatus are transported to the respective processing chamber lot by lot in accordance with the result of computation and are subjected to desired additional processes therein.

After having undergone the desired additional processes, the silicon wafers are removed from the apparatus of the present invention and are transported to the next mirror-polishing process E where the surface of each silicon wafer is polished. Through the above-described operation, mirror-polished silicon wafers having different specifications can be provided. Examples of such mirror-polished silicon wafers include silicon wafers having a gettering function and an autodoping prevention function imparted by a process in which amorphous silicon is deposited on the back surface of each silicon wafer in the processing chamber 11 and silicon oxide film is formed thereon in the processing chamber 12; silicon wafers which have gettering regions and whose oxygen donors have been anihilated by a process in which oxygen donors of each silicon wafer are anihilated through heat treatment in the processing chamber 14 and amorphous silicon is deposited on the back surface of the silicon wafer in the processing chamber 11; silicon wafers having a combined gettering effect imparted by a process in which damage is imparted to the back surface of each silicon wafer by plasma etching in the processing chamber 13 and amorphous silicon is subsequently deposited on the back surface in the processing chamber 11; silicon wafers having an autodoping prevention function imparted by a process in which silicon oxide film is formed on each silicon wafer in the processing chamber 12; and silicon wafers whose oxygen donors have been anihilated and to which a gettering function and an autodoping prevention function are imparted by a process in which oxygen donors of each silicon wafer are anihilated through heat treatment in the processing chamber 14, amorphous silicon is deposited on the back surface of the silicon wafer in the processing chamber 11, and silicon oxide film is formed on the amorphous silicon film in the processing chamber 12.

EXAMPLES

Next, the present invention will be described with reference to an example of the invention and a comparative example.

Example

Fifty silicon wafers having a diameter of 6 inches and having a (100) main surface were manufactured from each of two different silicon ingots and were subjected to the processes up to and including the etching process D shown in FIG. 1. The specifications of the thus-obtained material wafers are shown in Table 1.

The back surfaces of these material wafers were treated under the conditions shown in Table 1.

TABLE 1

| Lot No. | Spec. of material wafers | | Conditions of back surface treatment | |
|---|---|---|---|---|
| | Conductive type | Resistivity ($\Omega \cdot cm$) | First process | Second process |
| 001 | p | 0.01–0.02 | $\alpha$-Si (500 nm) | $SiO_2$ (200 nm) |
| 002 | n | 4–6 | RTP | $\alpha$-Si (500 nm) |

The material wafers of the two lots (100 wafers in total) were classified and cleaned lot by lot and were placed in the apparatus for processing silicon wafers of the present invention shown in FIG. 2 for treating the back surface of each wafer. For each lot, conditions of treatment were input to the controller 16 through the input section thereof.

The silicon wafers were subjected to the additional processes in the respective processing chambers one silicon wafer at a time. The processing conditions (such as a furnace inside temperature and a furnace inside pressure) at each processing chamber were set such that the processing time for each wafer at each processing chamber, including the time required for loading and unloading the wafer, became approximately two minutes.

The deposition of amorphous silicon (first process) for lot No. 1 and RTP (first process) for lot No. 2 were simultaneously performed in the processing chambers 11 and 14, respectively. After the first processes, the silicon wafers were taken out of the respective processing chambers 11 and 14 and transported to the processing chambers 12 and 11 for carrying out the respective second processes, without being cleaned. Like the first processes, the second processes were simultaneously performed at the processing chambers 12 and 11, respectively.

Accordingly, the time required to process the two lots including 100 wafers in total was about 240 minutes, including about 30 minutes used for cleaning the wafers before they were set into the apparatus.

Comparative Example

Fifty silicon wafers having the same specifications as those of the wafers used in Example were prepared for each kind. These wafers were subjected to processes shown in Table 2 through use of a conventional apparatus. That is, wafers of lot No. 3 and wafers of lot No. 4 were processed separately. As shown in Table 2, the silicon wafers were cleaned between the additional processes. The deposition of polycrystalline silicon was performed by a reduced-pressure CVD, while the formation of silicon oxide film was performed through use of an atmospheric-pressure CVD apparatus. The heat treatment for donor anihilation was performed in an inert gas atmosphere at a temperature of 650–700° C. for 30 minutes. Each additional process was performed for 50 wafers at a time.

TABLE 2

| Lot No. | Process flow |
|---------|--------------|
| 003 | Cleaning → Deposition of polycrystalline silicon → Cleaning → Formation of CVD silicon oxide film |
| 004 | Cleaning → Heat treatment for donor elimination → Cleaning → Deposition of polycrystalline silicon |

The total processing times were approximately 290 minutes and approximately 220 minutes, respectively. Therefore, even when both lots are processed simultaneously, at least 290 minutes is required to complete the entire processing.

The results of the above-described Example and Comparative example demonstrate that material wafers of different specifications can be subjected to a plurality of kinds of processing within the shortest possible time, thereby improving productivity.

The present invention is not limited to the above-described embodiments. The above-described embodiments are mere examples, and those having the substantially same structure as that described in the appended claims and providing the similar action and effects are included in the scope of the present invention.

What is claimed is:

1. An apparatus for processing silicon wafers, comprising:
   at least two processing chambers selected from a processing chamber for formation of a gettering region, a processing chamber for formation of a dopant-volatilization-prevention film, and a processing chamber for heat treatment for anihilation of oxygen donors; and
   silicon wafer transportation means for transporting to the respective processing chambers silicon wafers one silicon wafer at a time or a plurality of silicon wafers at a time,
   wherein the processing chambers can be operated simultaneously;
   the gettering region is formed by deposition of amorphous silicon on a main face of a silicon wafer using plasma chemical vapor deposition (CVD) or by imparting damage to the main face of the silicon wafer using plasma etching;
   the dopant-volatilization-prevention film comprises a silicon oxide film or a silicon nitride film formed using plasma CVD; and
   the heat treatment for anihilation of oxygen donors is effected by rapid thermal treatment using lamp heating.

2. An apparatus for processing silicon wafers, comprising:
   at least two processing chambers selected from a processing chamber for formation of a gettering region, a processing chamber for formation of a dopant-volatilization-prevention film, and a processing chamber for heat treatment for anihilation of oxygen donors;
   silicon wafer transportation means for transporting to the respective processing chambers silicon wafers one silicon wafer at a time or a plurality of silicon wafers at a time, the processing chambers can be operated simultaneously; and
   a controller which controls the processing chambers and the transportation means such that a plurality of kinds of processing can be performed for a plurality of silicon wafers within the shortest possible time;
   wherein the gettering region is formed by deposition of amorphous silicon on a main face of a silicon wafer using plasma chemical vapor deposition (CVD) or by imparting damage to the main face of the silicon wafer using plasma etching;
   the dopant-volatilization-prevention film comprises a silicon oxide film or a silicon nitride film formed using plasma CVD; and
   the heat treatment for anihilation of oxygen donors is effected by rapid thermal treatment using lamp heating.

3. An apparatus for processing silicon wafers according to claim 1, wherein the processing chambers are arranged around the transportation means and are connected together to form a cluster shape.

4. An apparatus for processing silicon wafers according to claim 2, wherein the processing chambers are arranged around the transportation means and are connected together to form a cluster shape.

5. A method of manufacturing mirror-polished silicon wafers, wherein the apparatus according to claim 1 is used to process the silicon wafer.

6. A method of manufacturing mirror-polished silicon wafers, wherein the apparatus according to claim 2 is used to process the silicon wafer.

7. A method of manufacturing mirror-polished silicon wafers, wherein the apparatus according to claim 3 is used to process the silicon wafer.

* * * * *